(12) United States Patent
Fagg

(10) Patent No.: US 8,378,751 B2
(45) Date of Patent: Feb. 19, 2013

(54) FREQUENCY SYNTHESIZER WITH MULTIPLE TUNING LOOPS

(75) Inventor: Russell John Fagg, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 141 days.

(21) Appl. No.: 12/371,428

(22) Filed: Feb. 13, 2009

(65) Prior Publication Data

US 2010/0207693 A1 Aug. 19, 2010

(51) Int. Cl.
*H03L 7/00* (2006.01)
(52) U.S. Cl. .......... 331/2; 331/10; 331/46; 331/47
(58) Field of Classification Search .......... 331/2, 10, 331/46, 47, 48, 50
See application file for complete search history.

(56) References Cited

U.S. PATENT DOCUMENTS

| | | | | |
|---|---|---|---|---|
| 4,114,110 A | * | 9/1978 | Nossen | 331/2 |
| 4,912,432 A | * | 3/1990 | Galani et al. | 331/2 |
| 5,128,633 A | * | 7/1992 | Martin et al. | 331/2 |
| 5,610,559 A | * | 3/1997 | Dent | 331/2 |
| 5,856,766 A | * | 1/1999 | Gillig et al. | 331/176 |
| 6,366,620 B1 | * | 4/2002 | Jackson et al. | 375/308 |
| 2003/0190903 A1 | * | 10/2003 | Melamed | 455/277.1 |
| 2003/0224748 A1 | | 12/2003 | Gomez et al. | |
| 2006/0160492 A1 | * | 7/2006 | Jensen | 455/76 |
| 2006/0170505 A1 | | 8/2006 | Humphreys et al. | |
| 2008/0024240 A1 | * | 1/2008 | Wang | 332/127 |

OTHER PUBLICATIONS

International Search Report and Written Opinion—PCT/US2010/024146, International Search Authority European Patent Office Apr. 28, 2010.
Toby K K et al., "A 2-V 1.8-GHZ Fully Intergrated CMOS Dual-Loop Frequency Snthesizer" IEEE Journal of Solid-State Circuits, IEEE Service Center, Piscataway, NJ, JS, vol. 37., No. 8, Aug. 1, 2002 pp. 1012-1020.

* cited by examiner

*Primary Examiner* — Joseph Chang
*Assistant Examiner* — Jeffrey Shin
(74) *Attorney, Agent, or Firm* — Kevin T. Cheatham

(57) ABSTRACT

A frequency synthesizer with multiple tuning loops, e.g., a fine tuning loop and a coarse tuning loop, is described. The fine tuning loop may operate over a limited tuning range and may have fine frequency resolution. The coarse tuning loop may operate over a wide tuning range and may have coarse frequency resolution. The fine tuning loop may receive a reference signal at a reference frequency and generate a fine tuning signal at a first frequency adjustable in fine steps. The coarse tuning loop may receive the reference signal, generate an output signal at an output frequency, and generate a coarse tuning signal at a second frequency based on the output signal and the fine tuning signal. The second frequency may be adjustable in coarse steps, e.g., in integer multiples of the reference frequency. The output frequency may be determined based on the first frequency and the second frequency.

39 Claims, 7 Drawing Sheets

FREQUENCY SYNTHESIZER WITH MULTIPLE TUNING LOOPS

BACKGROUND

I. Field

The present disclosure relates generally to electronics, and more specifically to a frequency synthesizer.

II. Background

A frequency synthesizer is a circuit that receives a reference signal at a reference frequency and generates an output signal at an output frequency. The output frequency may be related to the reference frequency by an integer ratio or a non-integer ratio, depending on the desired output frequency and the given reference frequency.

Frequency synthesizers are commonly used in various electronics devices. For example, a wireless device such as a cellular phone may include a frequency synthesizer to generate a local oscillator (LO) signal used for frequency downconversion or upconversion. The frequency synthesizer may receive a reference signal at a fixed frequency and generate the LO signal at a desired output frequency. The output frequency may be variable and dependent on the frequency channel used for communication. It is desirable to generate a clean LO signal having an accurate frequency in order to obtain good performance.

SUMMARY

A frequency synthesizer with multiple tuning loops and capable of achieving good performance and fine frequency resolution is described herein. In an exemplary design, the frequency synthesizer includes a fine tuning loop and a coarse tuning loop. Each tuning loop may comprise a set of circuit blocks coupled in a feedback loop and capable of adjusting the frequency of a signal provided by that tuning loop. Each tuning loop may be implemented with a phase-locked loop (PLL) or some other design. The fine tuning loop may operate over a limited tuning range and may have fine frequency resolution. The coarse tuning loop may operate over a wide tuning range and may have coarse frequency resolution. Tuning range refers to a range of frequencies over which a tuning loop can operate and hence the range of frequencies for the signal provided by the tuning loop. Wide tuning range with fine frequency resolution as well as other advantages may be obtained with the combination of the fine and coarse tuning loops.

In an exemplary design, the fine tuning loop may receive a reference signal at a reference frequency and generate a fine tuning signal at a first frequency, which may be adjustable in fine steps. The coarse tuning loop may receive the reference signal and generate an output signal at an output frequency. The coarse tuning loop may also generate a coarse tuning signal at a second frequency based on (e.g., by mixing) the output signal and the fine tuning signal. The second frequency may be adjustable in coarse steps, e.g., in integer multiples of the reference frequency. The output frequency may be determined based on the first frequency and the second frequency. The fine tuning loop and the coarse tuning loop may be implemented as described below.

Various aspects and features of the disclosure are described in further detail below.

DETAILED DESCRIPTION

The word "exemplary" is used herein to mean "serving as an example, instance, or illustration." Any design described herein as "exemplary" is not necessarily to be construed as preferred or advantageous over other designs.

Figure 1:
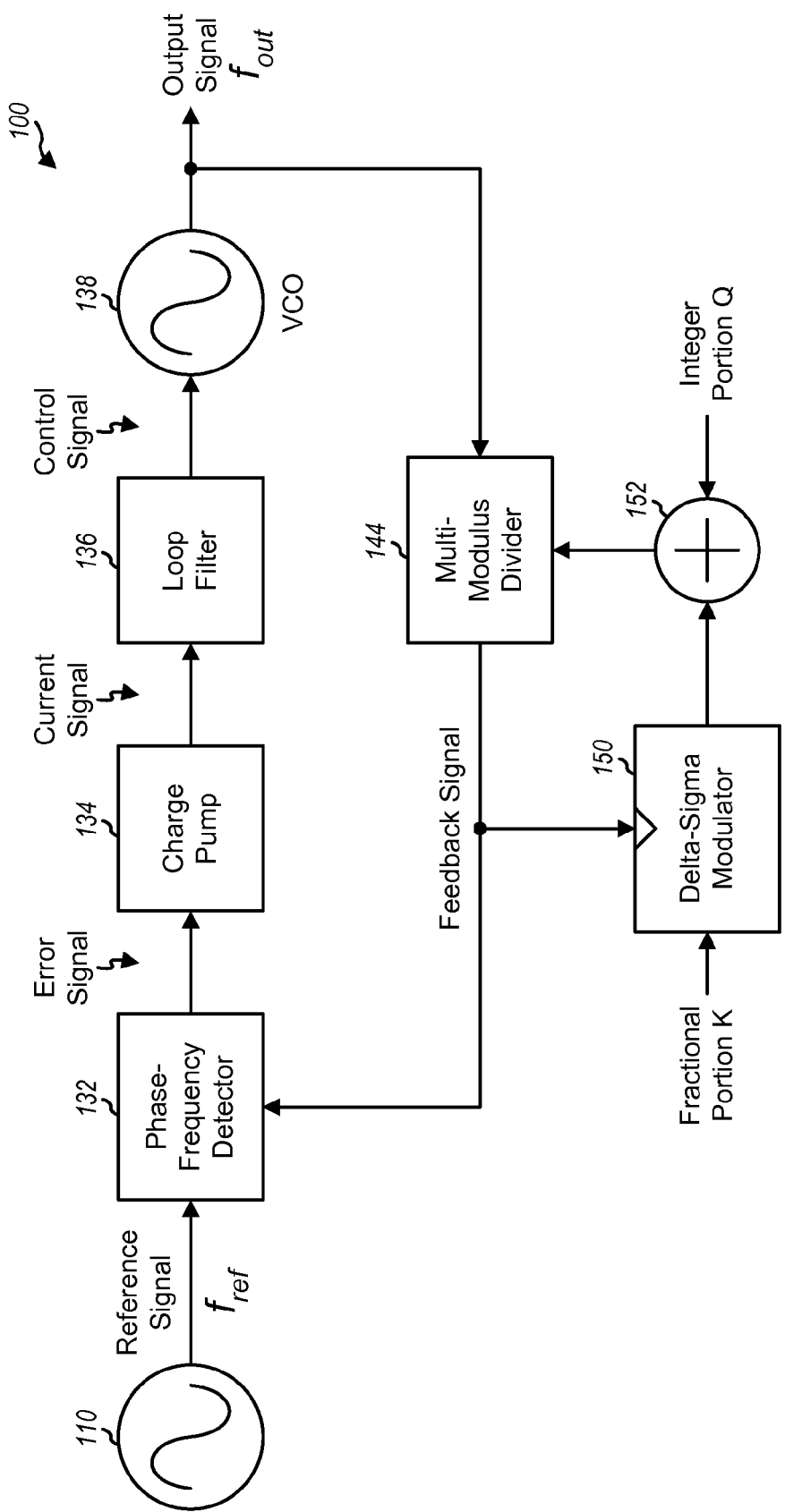
FIG. 1 shows a fractional-N frequency synthesizer with a single tuning loop.

FIG. 1 shows a block diagram of a fractional-N frequency synthesizer 100 with a single tuning loop. A reference oscillator 110 generates a reference signal having a precise frequency of $f_{ref}$. Oscillator 110 may be a crystal oscillator (XO), a voltage-controlled XO (VCXO), a temperature-compensated XO (TCXO), or some other type of oscillator. A phase-frequency detector 132 receives the reference signal and a feedback signal from a multi-modulus divider 144, compares the phases of the two signals, and provides an error signal that indicates the phase difference/error between the two input signals. A charge pump 134 receives the error signal and generates a current signal (or charge) that is proportional to the error signal. A loop filter 136 filters the current signal to provide a control signal. A voltage-controlled oscillator (VCO) 138 receives the control signal and generates an output signal having a frequency of $f_{out}$ determined by the control signal. Divider 144 divides the output signal in frequency by a divider ratio of N and provides the feedback signal to phase-frequency detector 132. The terms "divider ratio", "ratio" and "factor" are often used interchangeably.

The divider ratio N may be a non-integer value and may be decomposed into an integer portion Q and a fractional portion K, where $1 \leq Q$, $0 < K < 1$ and $N = Q + K$. A delta-sigma modulator (DSM) 150 receives the fractional portion K and generates a bit sequence of ones ('1') and zeros ('0'), with the percentage of ones being dependent on the fractional portion K. However, the ones and zeros are distributed in the bit sequence such that the majority of quantization noise is shaped to appear at high frequency and may be more easily filtered out by loop filter 136. A summer 152 sums the bit sequence from delta-sigma modulator 150 with the integer portion Q and provides an instantaneous divider ratio to divider 144. The instantaneous divider ratio may be equal to either Q or Q+1, depending on whether a zero or a one is provided by delta-sigma modulator 150.

Loop filter 136 and the open loop gain of frequency synthesizer 100 determine the closed-loop bandwidth of frequency synthesizer 100. It may be desirable to have a wide closed-loop bandwidth in order to obtain good dynamic performance, e.g., faster locking of the output signal to the reference signal, better suppression of noise from VCO 138, better rejection of frequency pulling effect from a nearby transmitter (if any), etc. A wide closed-loop bandwidth may also result in smaller capacitors and/or larger resistors for loop filter 136, which may facilitate integration of loop filter 136 on an integrated circuit (IC).

Frequency synthesizer 100 may be operated as a fractional-N frequency synthesizer. A fractional divider ratio N may be obtained by changing/dithering the instantaneous divider ratio between integer values of Q and Q+1 at the rate of the reference frequency, where Q is the largest integer value that is less than N. The instantaneous divider ratio can change once per cycle of the reference signal. The average of the instantaneous divider ratio is equal to the fractional divider ratio N. Quantization noise resulting from approximating the fractional divider ratio N with a sequence of integer divider ratios Q and Q+1 may be shaped by delta-sigma modulator 150 to concentrate at high frequencies outside of the closed-loop bandwidth of frequency synthesizer 100. The quantization noise may then be filtered by the low pass response of frequency synthesizer 100.

Fractional-N frequency synthesizer 100 may have certain limitations. First, noise shaping by delta-sigma modulator 150 may place certain restriction on the closed-loop bandwidth of frequency synthesizer 100. The noise shaping is dependent on an oversampling ratio (OSR), which is the ratio of the clock frequency for delta-sigma modulator 150 (i.e., the reference frequency in FIG. 1) to the closed-loop bandwidth of frequency synthesizer 100. In general, better noise shaping may be achieved with a higher OSR. For a given reference frequency, a high OSR may be obtained by reducing the closed-loop bandwidth. However, a smaller closed-loop bandwidth may be undesirable. A wider closed-loop bandwidth may be obtained with a smaller OSR. However, the smaller OSR may result in more quantization noise integrated within the closed loop bandwidth of the frequency synthesizer. Thus, the closed-loop bandwidth may be limited by noise shaping consideration. Second, higher linearity may be required for multi-modulus divider 144, phase-frequency detector 132, and charge pump 134 in frequency synthesizer 100. Non-linearity in these circuit blocks may result in the quantization noise from delta-sigma modulator 150 being folded to baseband and degrading noise performance. Fractional-N frequency synthesizer 100 may also have other limitations.

Frequency synthesizer 100 may also be operated as an integer-N frequency synthesizer. In this case, delta-sigma modulator 150 may be removed or provided with K=0 for the fractional portion. Divider 144 may divide the output signal in frequency by a fixed integer divider ratio, and the output frequency may be an integer multiple of the reference frequency. A low reference frequency may be used to achieve fine frequency resolution for the output signal. However, a low reference frequency may be undesirable for several reasons. First, the low reference frequency may limit the closed-loop bandwidth of frequency synthesizer 100, which is typically designed to be much lower than the reference frequency in order to sufficiently attenuate the reference signal. Second, a large divider ratio may be used to obtain the desired output frequency with the low reference frequency. The divider ratio acts as a multiplier for reference noise sources, e.g., reference oscillator 110, phase-frequency detector 132, charge pump 134, etc. Hence, a large divider ratio may equate to a large multiplier, which may be undesirable.

In an aspect, a frequency synthesizer with multiple tuning loops may be used to achieve good dynamic performance and fine frequency resolution. In one exemplary design, the frequency synthesizer includes a coarse tuning loop and a fine tuning loop. The fine tuning loop may also be referred to as a Vernier loop. The coarse tuning loop may operate over a wide tuning range and may have coarse frequency resolution, which may be given in an integer multiple of the reference frequency. The coarse tuning loop may have relaxed linearity requirements and may be designed with a wide closed-loop bandwidth due to relaxed quantization noise filtering requirements. The fine tuning loop may operate over a limited tuning range and may have fine frequency resolution, e.g., on the order of parts per million (ppm).

Figure 2:
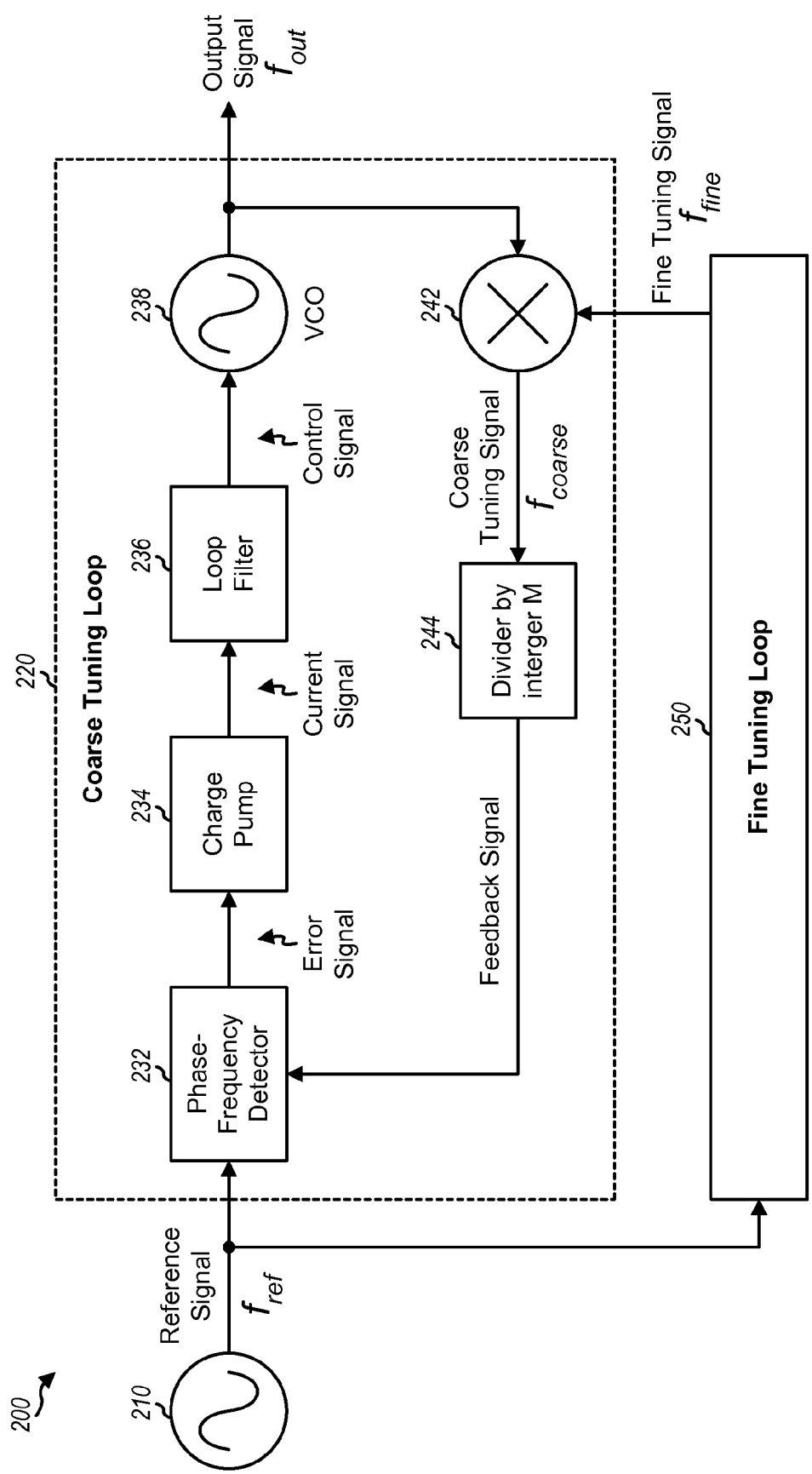
FIG. 2 shows an exemplary design of a frequency synthesizer with multiple tuning loops.

FIG. 2 shows a block diagram of an exemplary design of a frequency synthesizer 200 with multiple tuning loops. Frequency synthesizer 200 includes a coarse tuning loop 220 and a fine tuning loop 250. Coarse tuning loop 220 receives a reference signal having a frequency of $f_{ref}$ from a reference oscillator 210 and a fine tuning signal having a frequency of $f_{fine}$ from fine tuning loop 250. Coarse tuning loop 220 generates an output signal having a frequency of $f_{out}$, which may be given as:

$$f_{out} = f_{coarse} + f_{fine} = M \cdot f_{ref} + f_{fine}, \quad \text{Eq (1)}$$

where $f_{coarse} = M \cdot f_{ref}$ and M is an integer divider ratio.

Within coarse tuning loop 220, a phase-frequency detector 232 receives the reference signal and a feedback signal from a divider 244, compares the phases of the two signals, and provides an error signal that indicates the phase error between the two input signals. A charge pump 234 receives the error signal and generates a current signal that is proportional to the error signal. A loop filter 236 filters the current signal and provides a control signal. A VCO 238 generates the output signal having a frequency determined by the control signal. A mixer 242 mixes the output signal with the fine tune signal from fine tuning loop 250 and provides a coarse tuning signal. Divider 244 divides the coarse tuning signal in frequency by an integer divider ratio of M and provides the feedback signal to phase-frequency detector 232.

Fine tuning loop 250 receives the reference signal from reference oscillator 210 and generates the fine tuning signal. Fine tuning loop 250 may be implemented as described below. The desired output frequency may be obtained by selecting a suitable integer divider ratio M and a suitable fine frequency $f_{fine}$, as shown in equation (1).

Figure 3:
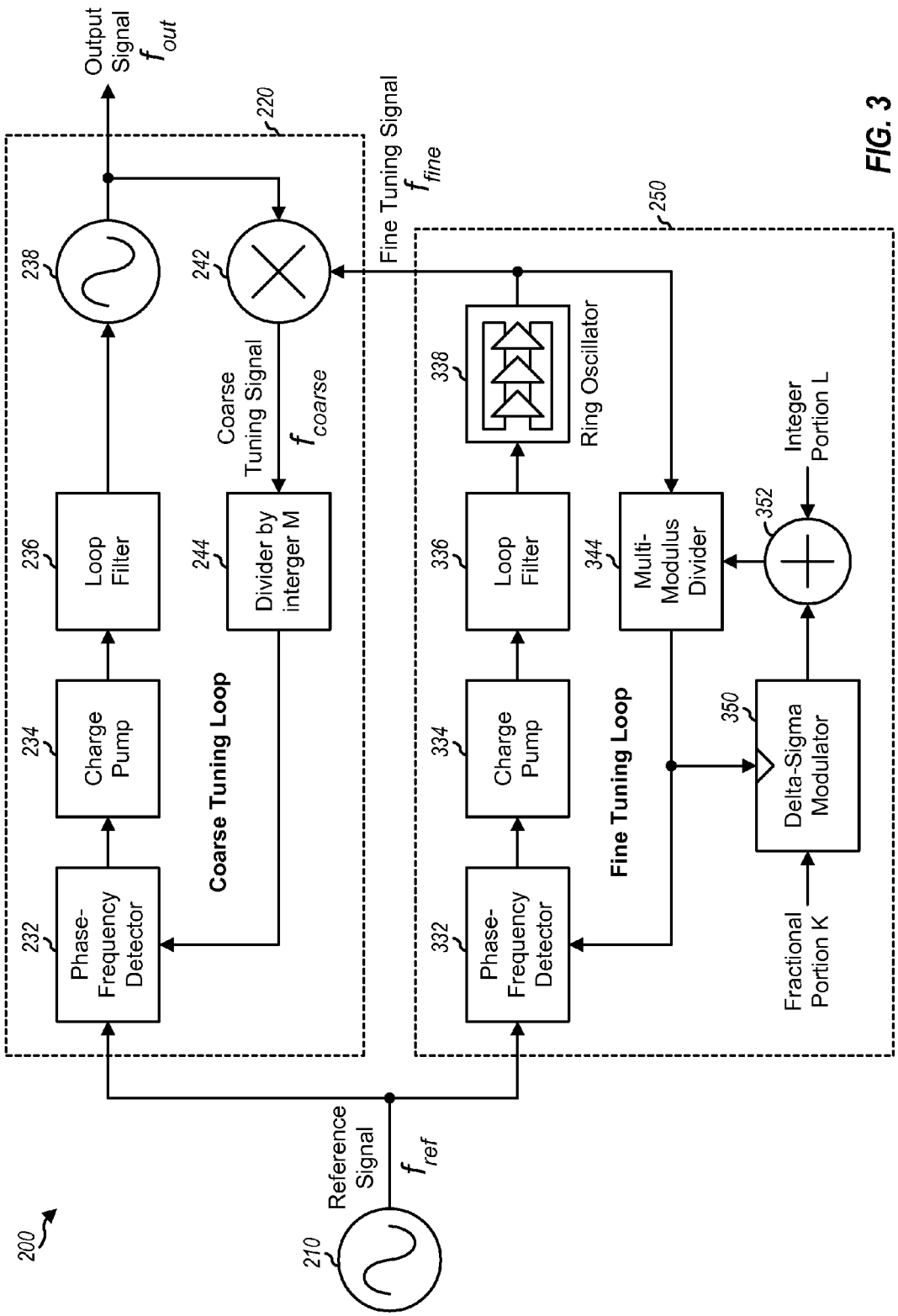
FIG. 3 shows a block diagram of the fine and coarse tuning loops within the frequency synthesizer in FIG. 2.

FIG. 3 shows a block diagram of an exemplary design of fine tuning loop 250 in frequency synthesizer 200 in FIG. 2. In this exemplary design, fine tuning loop 250 is implemented with a fractional-N PLL.

Within fine tuning loop 250, a phase-frequency detector 332 receives the reference signal from reference oscillator 210 and a feedback signal from a multi-modulus divider 344, compares the phases of the two signals, and provides an error signal. A charge pump 334 receives the error signal and generates a current signal. A loop filter 336 filters the current signal and provides a control signal. A VCO 338 receives the control signal and generates the fine tuning signal having a frequency determined by the control signal. In one exemplary design, VCO 338 may be implemented with a ring oscillator comprising multiple (e.g., three) delay cells coupled in a loop, as shown in FIG. 3. The oscillation frequency of the ring oscillator may be dependent on the delay of each delay cell, which may be controlled by the control signal from loop filter 336. Divider 344 divides the fine tuning signal in frequency by a divider ratio of P and provides the feedback signal to phase-frequency detector 332.

The frequency of the fine tuning signal may be given as follows:

$$f_{fine} = P \cdot f_{ref}, \quad \text{Eq (2)}$$

where 1<P is a divider ratio for the fine tuning signal.

The divider ratio P may be a non-integer value and may be decomposed into an integer portion L and a fractional portion K, where $1 \leq L$, $0 < K < 1$ and $P = L + K$. A delta-sigma modulator 350 receives the fractional portion K and generates a bit sequence of ones and zeros based on the fractional portion K. A summer 352 sums the bit sequence from delta-sigma modulator 350 with the integer portion L and provides an instantaneous divider ratio to divider 344. The instantaneous divider ratio may be equal to either L or L+1, depending on whether a zero or a one is provided by delta-sigma modulator 350.

The frequency of the output signal from coarse tuning loop 220 may be given as:

$$f_{out} = f_{coarse} + f_{fine} = M \cdot f_{ref} + (L+K) \cdot f_{ref} = N \cdot f_{ref} \quad \text{Eq (3)}$$

where N=L+M+K, with L and M being integer divider ratios, and K being the fractional portion of N.

As an example, the frequencies of various signals within frequency synthesizer 200 may be as follows:

$f_{ref}$=40 MHz, $f_{out}$=4003.33 MHz, $f_{coarse}$=3000.00 MHz, and $f_{fine}$=1003.33 MHz.

For the example given above, the divider ratios may be as follows:

M=75, L=25, and K=0.08325.

Figure 4:
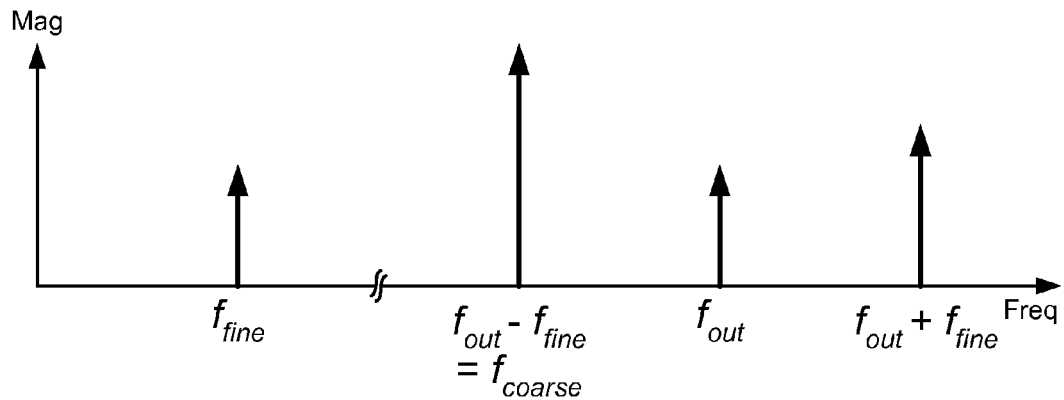
FIG. 4 shows a spectral plot of various signals within the frequency synthesizer in FIG. 2.

FIG. 4 shows an exemplary spectral plot of various signals within frequency synthesizer 200 in FIGS. 2 and 3. The output signal from VCO 238 has a frequency of $f_{out}$, and the fine tuning signal from fine tuning loop 250 has a frequency of $f_{fine}$. Mixer 242 mixes the output signal with the fine tuning signal and provides the coarse tuning signal, which may have (i) a lower sideband at the coarse frequency of $f_{coarse}=f_{out}-f_{fine}$ and (ii) an upper sideband at a frequency of $f_{out}+f_{fine}$. The lower sideband may be the desired sideband, and the upper sideband may be the undesired sideband.

The undesired sideband may be sub-sampled by phase-frequency detector 232 within coarse tuning loop 220 and may result in a spur appearing at low frequency. In the example given above, the undesired sideband would be at 5006.66 MHz and may be sub-sampled by phase-frequency detector 232 to generate a spur at 6.66 MHz. This spur may be filtered/attenuated by loop filter 236. The reference frequency and the output frequency may be selected such that the spur resulting from sub-sampling of the undesired sideband is sufficiently high in frequency and can be attenuated by loop filter 236.

In one exemplary design, mixer 242 within coarse tuning loop 220 may be implemented with a single-sideband (SSB) mixer that can provide a desired sideband at either high side or low side. The SSB mixer may be able to attenuate the undesired sideband by a sufficient amount, e.g., by approximately 40 decibels (dB). In another exemplary design, mixer 242 may be implemented with a double sideband (DSB) mixer that can provide both the desired sideband and the undesired sideband, e.g., as shown in FIG. 4. The undesired sideband may be attenuated by a sufficient amount (e.g., by approximately 10 dB) in order to avoid failure of divider 244 from amplitude modulation (AM) envelope. A filter may be placed between mixer 242 and divider 244 to attenuate the undesired sideband.

Figure 5:
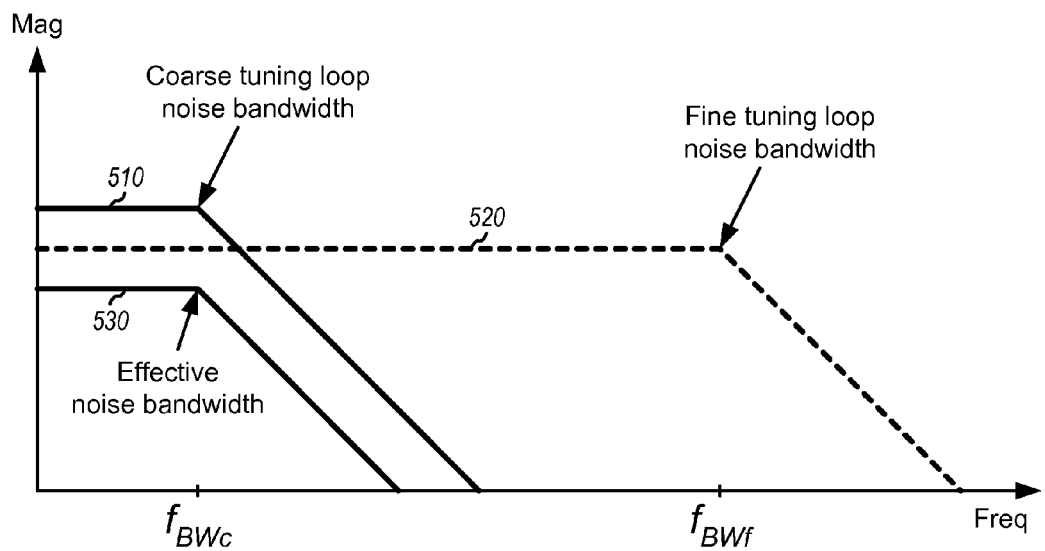
FIG. 5 shows frequency responses of the fine and coarse tuning loops.

FIG. 5 shows exemplary frequency responses of the fine and coarse tuning loops for frequency synthesizer 200 in FIGS. 2 and 3. A plot 510 shows a closed-loop response of coarse tuning loop 220, which may have a bandwidth of $f_{BWc}$. A plot 520 shows a closed-loop response of fine tuning loop 250, which may have a bandwidth of $f_{BWf}$. The closed-loop bandwidth of fine tuning loop 250 may be much wider than (e.g., at least twice) the closed-loop bandwidth of coarse tuning loop 220. A plot 530 shows an effective closed-loop response for frequency synthesizer 200, which may have a bandwidth of $f_{BWeff}$. The effective closed-loop bandwidth may be approximately equal to the closed-loop bandwidth of coarse tuning loop 220.

The closed-loop bandwidth of coarse tuning loop 220 may be set relatively high (e.g., to about 400 KHz for the example given above) in order to obtain good dynamic performance for the coarse tuning loop. The closed-loop bandwidth of fine tuning loop 250 may also be set relatively high (e.g., to about 4 MHz for the example given above) in order to obtain good dynamic performance for the fine tuning loop. In general, the closed-loop bandwidth of each tuning loop may be selected to obtain the desired dynamic performance.

Referring back to FIG. 3, VCO 338 may be implemented with a ring oscillator, as described above. A ring oscillator may consume low power and occupy a small area, both of which may be desirable. However, a ring oscillator may have poor phase noise characteristics. Fine tuning loop 250 may be designed with a wide closed-loop bandwidth in order to suppress the noise from the ring oscillator. More quantization noise from delta-sigma modulator 350 may be passed through the wide closed-loop bandwidth of fine tuning loop 250 and provided to coarse tuning loop 220. However, the quantization noise would be filtered by the closed-loop bandwidth of coarse tuning loop 220. Thus, the effective noise bandwidth may be determined by the more narrow closed-loop bandwidth of coarse tuning loop 220.

Figure 6:
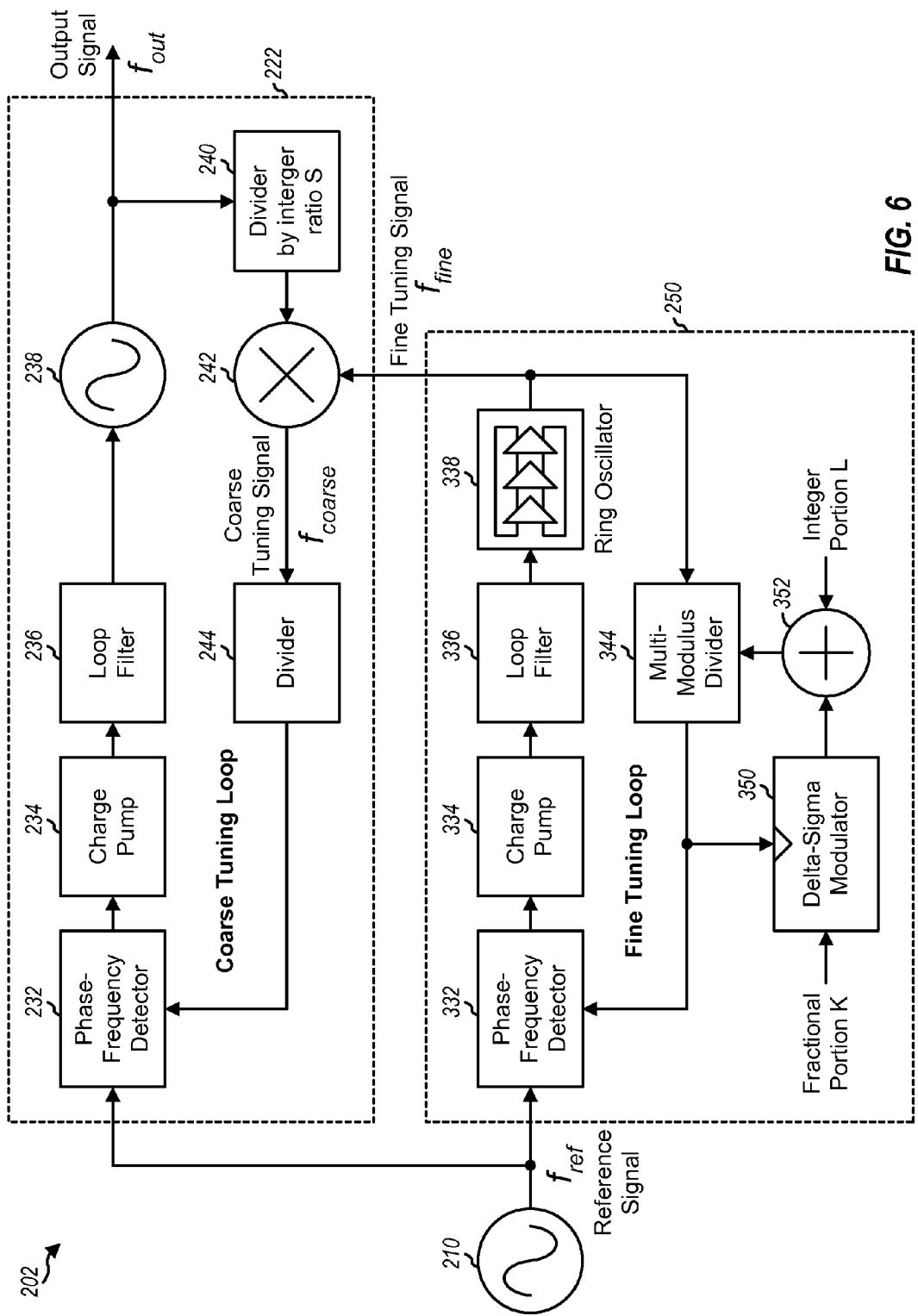
FIG. 6 shows another exemplary design of a frequency synthesizer with multiple tuning loops.

FIG. 6 shows a block diagram of an exemplary design of a frequency synthesizer 202 with multiple tuning loops. Frequency synthesizer 202 may be designed to provide an output signal at a very high frequency, e.g., more than 10 GHz. Frequency synthesizer 202 includes a coarse tuning loop 222 and fine tuning loop 250.

Coarse tuning loop 222 includes phase-frequency detector 232, charge pump 234, loop filter 236, VCO 238, mixer 242, and divider 244, which may operate as described above for FIG. 2. Coarse tuning loop 222 further includes a divider 240 that receives the output signal from VCO 238, divides the output signal in frequency by an integer divider ratio S (e.g., by two or four), and provides a divider output signal. Mixer 242 mixes the divider output signal with the fine tuning signal from fine tuning loop 250 and provides the coarse tuning signal. Divider 244 divides the coarse tuning signal in frequency by an integer ratio or a non-integer ratio and provides the feedback signal to phase-frequency detector 232.

Fixed modulus divider 240 may be used to divide the output signal, which may avoid the need to design a high frequency pre-scalar. A pre-scalar is a divider that can divide by two divider ratios (e.g., by 2 and 3). If divider 244 divides by a fixed integer ratio, then the output frequency may be adjusted in coarse steps of $S \cdot f_{ref}$, where S is the divider ratio of divider 240. The use of divider 240 may thus result in larger coarse steps, which may be addressed in several ways. First, the coarse steps may be improved by using a phase switching pre-scalar for divider 244. Divider 244 may then be able to divide the coarse tuning signal by an integer divider ratio (e.g., by 8) or a mid non-integer divider ratio (e.g., by 8.5). A mid non-integer divider ratio is a divider ratio that is at the center of two consecutive integer values. Second, the tuning range of fine tuning loop 250 may be increased from $f_{ref}$ to $S \cdot f_{ref}$ by using a sufficient number of extra bits for the fraction portion K provided to delta-sigma modulator 350 and extending the tuning range of ring oscillator 338.

FIGS. 3 and 6 show two exemplary designs of a coarse tuning loop for a frequency synthesizer with multiple tuning loops. The coarse tuning loop may also be implemented with other designs. For example, the phase-frequency detector and the charge pump may be implemented with a mixer and/or other circuits.

FIGS. 3 and 6 also show an exemplary design of a fine tuning loop for a frequency synthesizer with multiple tuning loops. The fine tuning loop may also be implemented with other designs. For example, other types of oscillators may be used instead of a ring oscillator. Delta-sigma modulator 350 and/or multi-modulus divider 344 may also be implemented with other circuits. The fine tuning loop may also be implemented with a numerically controlled oscillator (NCO) or may be based on an NCO. The fine tuning loop may also use an LC tank oscillator or some other types of oscillator. The fine tuning signal may also be from an external programmable frequency source.

In the exemplary designs shown in FIGS. 3 and 6, fine tuning loop 250 receives the reference signal and operates at the reference frequency. In another exemplary design, fine tuning loop 250 may operate at a frequency lower than the reference frequency, e.g., at half the reference frequency. A lower operating frequency for fine tuning loop 250 may result in lower power consumption by phase-frequency detector 332 and charge pump 334 and may also provide finer frequency resolution for a given word length for delta-sigma modulator 350.

In the exemplary designs shown in FIGS. 3 and 6, the fractional portion K may be selected to obtain the desired output frequency and may be a fixed value. In another exemplary design, phase modulation (PM) or frequency modulation (FM) may be applied to delta-sigma modulator 350 instead of, or in addition to, the fractional portion K. Frequency synthesizers 200 and 202 may thus be used for phase or frequency modulation.

A frequency synthesizer with multiple loops described herein may provide certain advantages. The multi-loop frequency synthesizer may avoid design trade-offs of a single-loop fractional-N frequency synthesizer by splitting the problem into two manageable parts—a coarse tuning loop and a fine tuning loop. Each tuning loop may be designed with relatively wide closed-loop bandwidth to obtain good dynamic performance. Quantization noise from the fine tuning loop may be filtered by both the closed-loop bandwidth of the fine tuning loop and the closed-loop bandwidth by the coarse tuning loop. Filtering of the quantization noise by the fine tuning loop reduces statistical noise variance. The coarse tuning loop may then have relaxed linearity requirements. The effective noise bandwidth may be reduced substantially (e.g., from 4 MHz down to 400 KHz in the example described above). The lower effective noise bandwidth may relax the linearity requirements the divider, the phase-frequency detector, and the charge pump within the fine tuning loop. The fine tuning loop may be implemented with differential circuits, e.g., differential phase-frequency detector, differential charge pump, differential loop filter, etc. This may reduce susceptibility to noise coupling, enable accurate bandwidth control, and allow for use of a ring oscillator. The fine tuning loop may also be implemented on an IC to reduce cost and size.

In an exemplary design, an apparatus may comprise a frequency synthesizer including a fine tuning loop and a coarse tuning loop, e.g., as shown in FIG. 3. The fine tuning loop may receive a reference signal at a reference frequency $f_{ref}$ and generate a fine tuning signal at a first frequency (e.g., $f_{fire}$) adjustable in fine steps. The coarse tuning loop may receive the reference signal and generate an output signal at an output frequency (e.g., $f_{out}$). The output frequency may be determined based on the first frequency and a second frequency (e.g., $f_{coarse}$), which may be adjustable in coarse steps.

In an exemplary design, the coarse steps may be integer multiples of the reference frequency. In an exemplary design, the fine steps may be integer multiples of a minimum step size, which may correspond to a fraction of the reference frequency. For example, the minimum step size may be $f_{min}=f_{ref}/2^B$, where B is the number of bits for the fractional portion K.

In an exemplary design, the coarse tuning loop may comprise a phase-frequency detector, a charge pump, a loop filter, a VCO, and a mixer, e.g., as shown in FIG. 2. The mixer may receive the output signal and the fine tuning signal and provide a coarse tuning signal at the second frequency. The divider may divide the coarse tuning signal in frequency (e.g., by an integer ratio) and provide a feedback signal at the reference frequency. The phase-frequency detector may receive the reference signal and the feedback signal and provide an error signal. The charge pump may receive the error signal and provide a current signal. The loop filter may filter the current signal and provide a control signal. The VCO may receive the control signal and provide the output signal. The coarse tuning loop may further comprise a second divider, which may divide the output signal in frequency by an integer ratio and provide a divider output signal, e.g., as shown in FIG. 6. The mixer may then receive the divider output signal (instead of the output signal) and the fine tuning signal and provide the coarse tuning signal.

In an exemplary design, the fine tuning loop may comprise a ring oscillator, a multi-modulus divider, a delta-sigma modulator, a summer, a second phase-frequency detector, a second charge pump, and a second loop filter, e.g., as shown in FIG. 3. The multi-modulus divider may divide the fine tuning signal in frequency by a non-integer ratio and provide a second feedback signal. The second phase-frequency detector may receive the reference signal and the second feedback signal and provide a second error signal. The second charge pump may receive the second error signal and provide a second current signal. The second loop filter may filter the second current signal and provide a second control signal. The ring oscillator may receive the second control signal and generate the fine tuning signal. The delta-sigma modulator may receive a fractional portion of the non-integer ratio and provide a modulator output, e.g., a bit sequence. The summer may sum the modulator output and an integer portion of the non-integer ratio and provide an instantaneous divider ratio to the multi-modulus divider. The closed-loop bandwidth of the fine tuning loop may be wider than the closed-loop bandwidth of the coarse tuning loop, e.g., by a factor of at least two.

In another exemplary design, an apparatus may comprise a frequency synthesizer that may receive a reference signal at a reference frequency and generate an output signal at an output frequency. The frequency synthesizer may generate a fine tuning signal at a first frequency based on the reference signal or may receive the fine tuning signal from an external source. The frequency synthesizer may generate a coarse tuning signal at a second frequency based on the output signal and the fine tuning signal. The second frequency may be an integer multiple of the reference frequency. The output frequency may be a non-integer multiple of the reference frequency and may be determined by the first frequency and the second frequency.

Figure 7A:
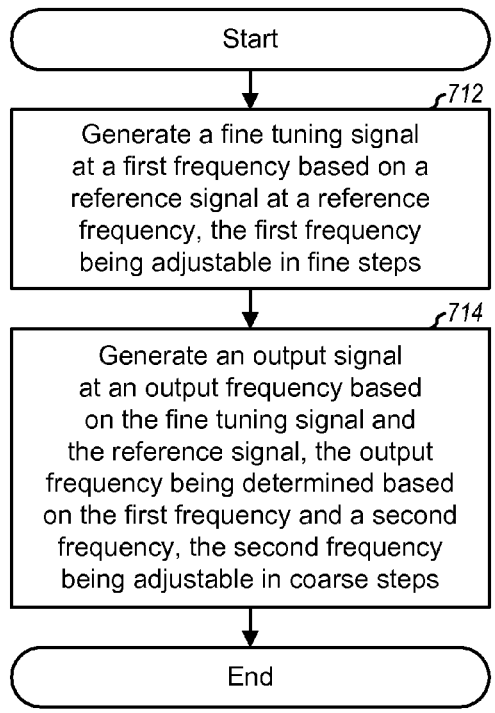
FIGS. 7A, 7B and 7C show a process for generating an output signal.

FIG. 7A shows an exemplary design of a process 700 for generating an output signal. A fine tuning signal at a first frequency may be generated based on a reference signal at a reference frequency (block 712). The first frequency may be adjustable in fine steps. An output signal at an output frequency may be generated based on the fine tuning signal and the reference signal (block 714). The output frequency may be determined based on the first frequency and a second frequency. The second frequency may be adjustable in coarse steps. The output signal may be generated with a coarse tuning loop having a first closed-loop bandwidth. The fine tuning signal may be generated with a fine tuning loop having a second closed-loop bandwidth, which may be wider than the first closed-loop bandwidth, e.g., by a factor of at least two.

Figure 7B:
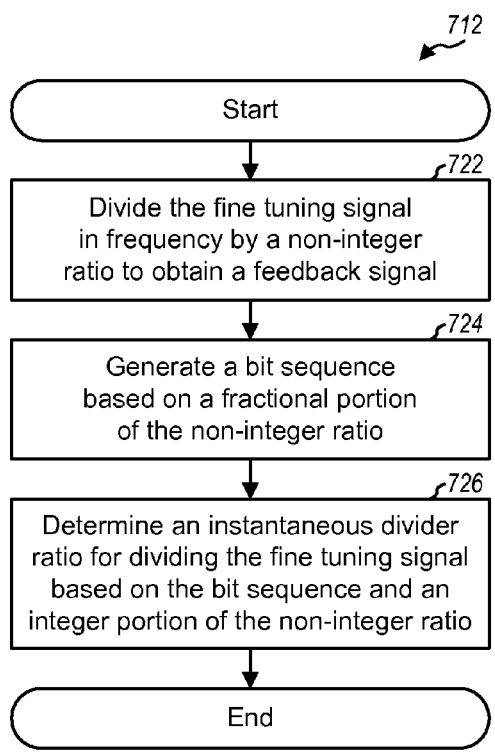

FIG. 7B shows an exemplary design of block 712 in FIG. 7A. The fine tuning signal may be divided in frequency by a non-integer ratio to obtain a feedback signal (block 722). The non-integer ratio may comprise a fractional portion (e.g., K) and an integer portion (e.g., L). A bit sequence may be generated based on the fractional portion of the non-integer ratio, e.g., based on a delta-sigma modulator (block 724). An instantaneous divider ratio for dividing the fine tuning signal may be determined based on the bit sequence and the integer portion of the non-integer ratio (block 726). The instantaneous divider ratio may toggle between two consecutive integer values (e.g., between L and L+1) in a manner to obtain the fractional portion and achieve noise shaping of quantization noise.

Figure 7C:
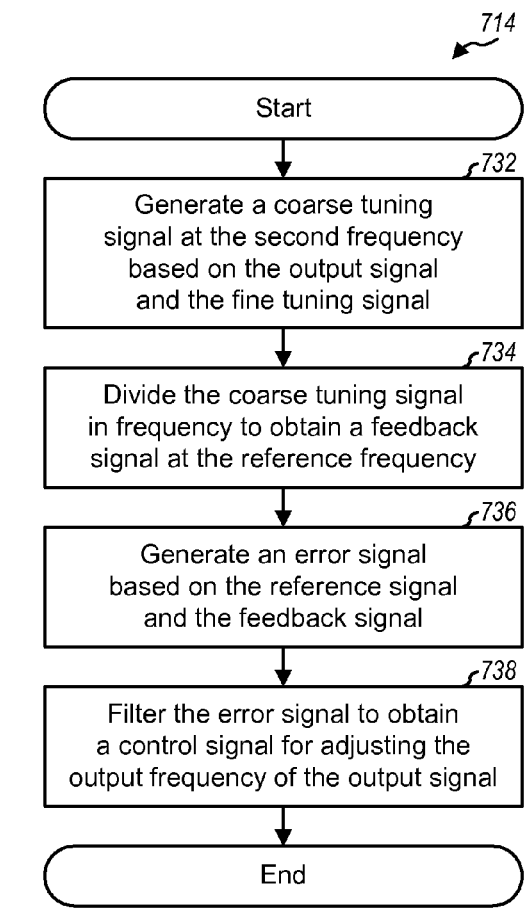

FIG. 7C shows an exemplary design of block 714 in FIG. 7A. A coarse tuning signal at the second frequency may be generated based on the output signal and the fine tuning signal (block 732). The coarse tuning signal may be divided in frequency (e.g., by an integer ratio) to obtain a feedback signal at the reference frequency (block 734).

An error signal may be generated based on the reference signal and the feedback signal (block 736). The error signal may be filtered to obtain a control signal for adjusting the output frequency of the output signal (block 738).

Although not shown in FIG. 7C, the output signal may be divided in frequency by an integer ratio to obtain a divider output signal, e.g., as shown in FIG. 6. The coarse tuning signal may then be generated based on the divider output signal (instead of the output signal) and the fine tuning signal.

The frequency synthesizer with multiple loops described herein may be used for various applications such as wireless communication, computing, networking, consumer electronics, etc. The frequency synthesizer may also be used for various electronics devices such as wireless communication devices, cellular phones, broadcast receivers, personal digital assistants (PDAs), handheld devices, wireless modems, laptop computers, cordless phones, Bluetooth devices, wireless local loop (WLL) stations, consumer electronics devices, etc. For clarity, the use of the frequency synthesizer in a wireless communication device, which may be a cellular phone or some other device, is described below. The frequency synthesizer may be used to generate a transmit local oscillator (LO) signal for a transmitter and/or a receive LO signal for a receiver in the wireless device.

Figure 8:
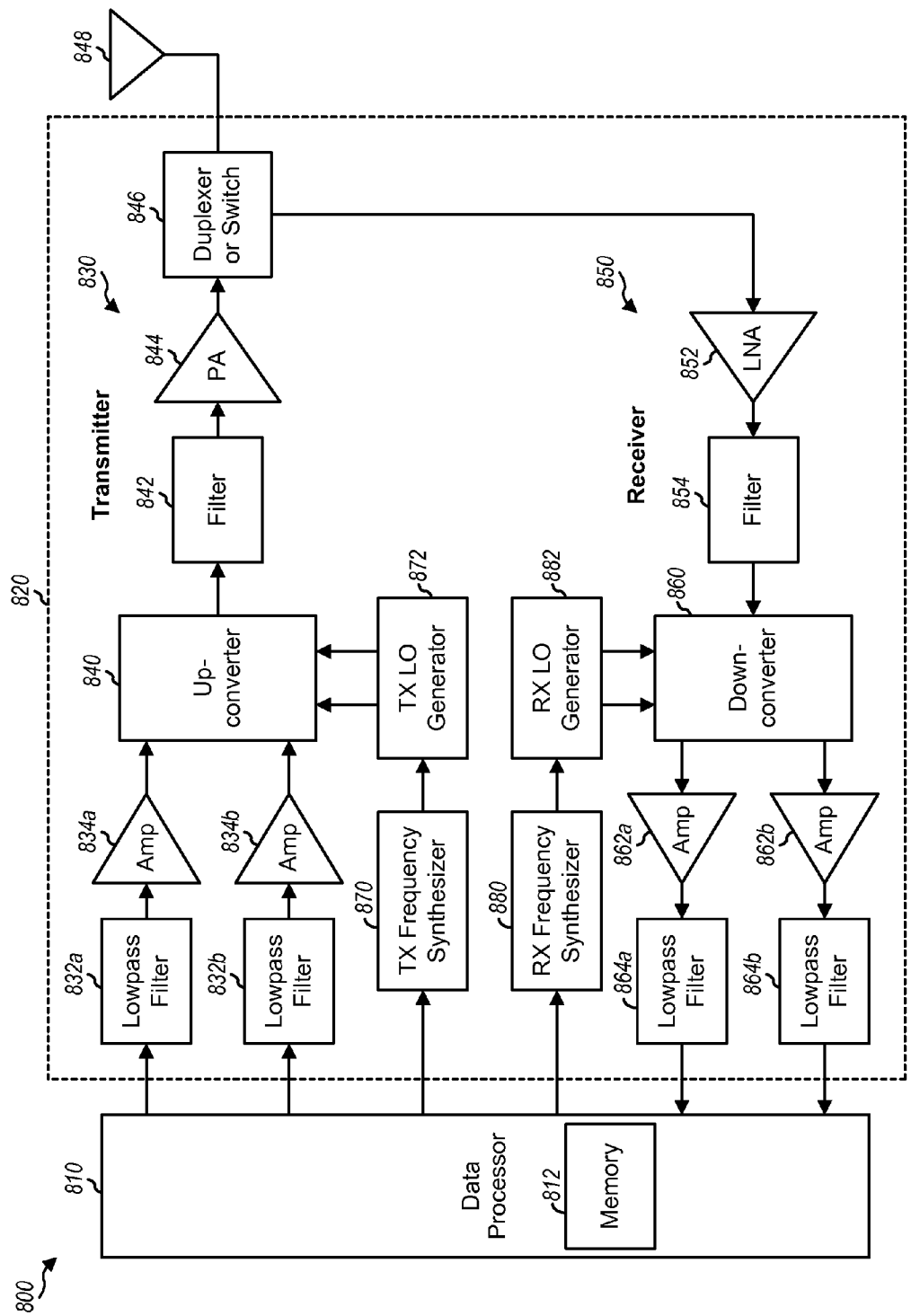
FIG. 8 shows a block diagram of a wireless communication device.

FIG. 8 shows a block diagram of an exemplary design of a wireless communication device 800. In this design, wireless device 800 includes a data processor 810 having a memory 812 to store data and program codes and a transceiver 820. Transceiver 820 includes a transmitter 830 and a receiver 850 that support bi-directional communication. In general, wireless device 800 may include any number of transmitters and any number of receivers for any number of communication systems and any number of frequency bands.

A transmitter or a receiver may be implemented with a super-heterodyne architecture or a direct-conversion architecture. In the super-heterodyne architecture, a signal is frequency converted between radio frequency (RF) and baseband in multiple stages, e.g., from RF to an intermediate frequency (IF) in one stage, and then from IF to baseband in another stage for a receiver. In the direct-conversion architecture, which is also referred to as a zero-IF architecture, a signal is frequency converted between RF and baseband in one stage. The super-heterodyne and direct-conversion architectures may use different circuit blocks and/or have different requirements. In the exemplary design shown in FIG. 8, transmitter 830 and receiver 850 are implemented with the direct-conversion architecture.

In the transmit path, data processor 810 processes data to be transmitted and provides inphase (I) and quadrature (Q) analog output signals to transmitter 830. Within transmitter 830, lowpass filters 832a and 832b filter the I and Q analog output signals, respectively, to remove undesired images caused by the prior digital-to-analog conversion. Amplifiers (Amp) 834a and 834b amplify the signals from lowpass filters 832a and 832b, respectively, and provide I and Q baseband signals. An upconverter 840 receives and upconverts the I and Q baseband signals with a complex transmit LO signal from a transmit (TX) LO generator 872 and provides an upconverted signal. A filter 842 filters the upconverted signal to remove undesired images caused by the frequency upconversion and to remove noise in a receive frequency band. A power amplifier (PA) 844 amplifies the signal from filter 842 to obtain the desired output power level and provides a transmit RF signal. The transmit RF signal is routed through a duplexer or switch 846 and transmitted via an antenna 848.

In the receive path, antenna 848 receives signals transmitted by base stations and/or other transmitter stations and provides a received radio frequency (RF) signal, which is routed through duplexer or switch 846 and provided to a low noise amplifier (LNA) 852. The received RF signal is amplified by LNA 852 and filtered by a filter 854 to obtain an input RF signal. A downconverter 860 downconverts the input RF signal with a complex receive LO signal from a receive (RX) LO generator 882 and provides I and Q baseband signals. The I and Q baseband signals are amplified by amplifiers 862a and 862b and further filtered by lowpass filters 864a and 864b to obtain I and Q analog input signals, which are provided to data processor 810.

A TX frequency synthesizer 870 receives control information (e.g., for integer portion L, fractional portion K, and integer divider ratio M for the desired transmit frequency) from data processor 810 and generates a first output signal at a desired transmit frequency. Frequency synthesizer 870 may be implemented with frequency synthesizer 200 in FIG. 3, frequency synthesizer 202 in FIG. 6, or some other frequency synthesizer with multiple loops. LO generator 872 generates the complex transmit LO signal used for frequency upconversion based on the first output signal.

An RX frequency synthesizer 880 receives control information (e.g., for integer portion L, fractional portion K, and integer divider ratio M for the desired receive frequency) from data processor 810 and generates a second output signal at a desired receive frequency. Frequency synthesizer 880 may be implemented with frequency synthesizer 200 in FIG. 3, frequency synthesizer 202 in FIG. 6, or some other frequency synthesizer with multiple loops. LO generator 882 generates the complex receive LO signal used for frequency downconversion based on the second output signal.

FIG. 8 shows an exemplary transceiver design. In general, the conditioning of the signals in a transmitter and a receiver may be performed by one or more stages of amplifier, filter, upconverter, downconverter, etc. These circuit blocks may be arranged differently from the configuration shown in FIG. 8. Furthermore, other circuit blocks not shown in FIG. 8 may also be used to condition the signals in the transmitter and the receiver. Some circuit blocks in FIG. 8 may also be omitted.

All or a portion of transceiver 820 may be implemented on one or more analog integrated circuits (ICs), RF ICs (RFICs), mixed-signal ICs, etc.

The frequency synthesizer with multiple loops described herein may be implemented on an IC, an analog IC, an RFIC, a mixed-signal IC, an application specific integrated circuit (ASIC), a printed circuit board (PCB), an electronics device, etc. The frequency synthesizer may also be fabricated with various IC process technologies such as complementary metal oxide semiconductor (CMOS), N-channel MOS (NMOS), P-channel MOS (PMOS), bipolar junction transistor (BJT), bipolar-CMOS (BiCMOS), silicon germanium (SiGe), gallium arsenide (GaAs), etc.

An apparatus implementing the frequency synthesizer described herein may be a stand-alone device or may be part of a larger device. A device may be (i) a stand-alone IC, (ii) a set of one or more ICs that may include memory ICs for storing data and/or instructions, (iii) an RFIC such as an RF receiver (RFR) or an RF transmitter/receiver (RTR), (iv) an ASIC such as a mobile station modem (MSM), (v) a module that may be embedded within other devices, (vi) a receiver, cellular phone, wireless device, handset, or mobile unit, (vii) etc.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosure is provided to enable any person skilled in the art to make or use the disclosure. Various modifications to the disclosure will be readily apparent to those skilled in the art, and the generic principles defined herein may be applied to other variations without departing from the scope of the disclosure. Thus, the disclosure is not intended to be limited to the examples and designs described herein but is to be accorded the widest scope consistent with the principles and novel features disclosed herein.

What is claimed is:

1. An apparatus for generating an output signal at an output frequency, the apparatus comprising:
a frequency synthesizer including:
a fine tuning loop operative to:
receive a reference signal at a reference frequency; and
generate a fine tuning signal at a first frequency adjustable in fine steps, wherein the first frequency is determined by multiplying the reference frequency by a non-integer ratio; and
a coarse tuning loop coupled to the fine tuning loop and operative to:
receive the reference signal; and
generate the output signal at the output frequency, the output frequency being determined based on the first frequency and a second frequency, the second frequency adjustable in coarse steps, wherein a closed-loop bandwidth of the frequency synthesizer is based on noise shaping, and wherein the noise shaping is based on an oversampling ratio;
wherein the coarse tuning loop includes a mixer operative to generate a coarse tuning signal at the second frequency, wherein the coarse tuning signal has a first sideband defined by a difference between the output frequency and the first frequency, and wherein the coarse tuning signal has a second sideband defined by a sum of the output frequency and the first frequency.

2. The apparatus of claim 1, wherein the mixer is further operative to receive the output signal and the fine tuning signal, and wherein the coarse tuning signal is generated based on the output signal and the fine tuning signal.

3. The apparatus of claim 1, wherein the mixer comprises a single sideband (SSB) mixer.

4. The apparatus of claim 1, wherein the coarse tuning loop further comprises:
a divider operative to divide the coarse tuning signal in frequency and provide a feedback signal at the reference frequency,
a phase-frequency detector operative to receive the reference signal and the feedback signal and provide an error signal,
a charge pump operative to receive the error signal and provide a current signal,
a loop filter operative to filter the current signal and provide a control signal, and
a voltage-controlled oscillator (VCO) operative to receive the control signal and provide the output signal.

5. The apparatus of claim 4, wherein the divider is operative to divide the coarse tuning signal in frequency by an integer ratio.

6. The apparatus of claim 4, wherein the divider is operative to divide the coarse tuning signal in frequency by an integer ratio or a mid non-integer ratio.

7. The apparatus of claim 1, wherein the coarse tuning loop further comprises a divider operative to divide the output signal in frequency by an integer ratio and provide a divider output signal.

8. The apparatus of claim 1, wherein the fine tuning loop comprises a ring oscillator operative to generate the fine tuning signal.

9. The apparatus of claim 1, wherein the fine tuning loop comprises:
a multi-modulus divider operative to divide the fine tuning signal in frequency by the non-integer ratio and provide a feedback signal;

a delta-sigma modulator operative to generate a bit sequence based on a fractional portion input; and
a summer operative to sum the bit sequence with an integer portion input to generate the non-integer ratio.

10. The apparatus of claim 9, wherein the delta-sigma modulator is operative to receive a phase modulation signal or a frequency modulation signal.

11. The apparatus of claim 1, wherein a closed-loop bandwidth of the fine tuning loop is wider than a closed-loop bandwidth of the coarse tuning loop by a factor of at least two.

12. The apparatus of claim 1, wherein the coarse steps comprise integer multiples of the reference frequency.

13. The apparatus of claim 1, wherein the fine steps comprise integer multiples of a particular step size corresponding to a fraction of the reference frequency.

14. The apparatus of claim 1, wherein the oversampling ratio is a ratio of the reference frequency to the closed-loop bandwidth of the frequency synthesizer.

15. An apparatus for generating an output signal at an output frequency, the apparatus comprising:
a frequency synthesizer configured to:
receive a first reference signal at a first reference frequency and a second reference signal at a second reference frequency, wherein the first reference frequency is lower than the second reference frequency;
generate an output signal at an output frequency, wherein the output frequency is determined by a first frequency and a second frequency;
generate a fine tuning signal at the first frequency that is determined by multiplying the first reference frequency by a non-integer ratio that comprises an integer portion and a fractional portion; and
generate a coarse tuning signal at the second frequency based on the output signal and the fine tuning signal, wherein the second frequency is an integer multiple of the second reference frequency, wherein a closed-loop bandwidth of the frequency synthesizer is based on noise shaping, and wherein the noise shaping is based on an oversampling ratio;
wherein the coarse tuning signal has a first sideband defined by a difference between the output frequency and the first frequency, and wherein the coarse tuning signal has a second sideband defined by a sum of the output frequency and the first frequency.

16. The apparatus of claim 15, wherein the first frequency is adjustable in integer multiples of a particular step size corresponding to a fraction of the first reference frequency, and wherein the second frequency is adjustable in integer multiples of the second reference frequency.

17. The apparatus of claim 15, wherein the frequency synthesizer comprises a mixer operative to receive the output signal and the fine tuning signal and provide the coarse tuning signal.

18. The apparatus of claim 15, wherein the frequency synthesizer is further operative to generate the fine tuning signal based on the first reference signal.

19. The apparatus of claim 15, wherein the oversampling ratio is a ratio of the second reference frequency to the closed-loop bandwidth of the frequency synthesizer.

20. The apparatus of claim 15, wherein the first reference frequency is half of the second reference frequency.

21. A device comprising:
a frequency synthesizer operative to:
generate a fine tuning signal at a first frequency based on a reference signal at a reference frequency, wherein the first frequency is determined by multiplying the reference frequency by a non-integer ratio;
generate an output signal at an output frequency based on the first frequency and a second frequency, the first frequency adjustable in fine steps, the second frequency adjustable in coarse steps, wherein a closed-loop bandwidth of the frequency synthesizer is based on noise shaping, and wherein the noise shaping is based on an oversampling ratio; and
generate a coarse tuning signal at the second frequency based on the output signal and the fine tuning signal, wherein the coarse tuning signal has a first sideband defined by a difference between the output frequency and the first frequency, and wherein the coarse tuning signal has a second sideband defined by a sum of the output frequency and the first frequency;
a local oscillator (LO) generator coupled to the frequency synthesizer and operative to receive the output signal and generate an LO signal;
a frequency converter coupled to the LO generator and operative to frequency covert an input signal with the LO signal and provide a frequency converted signal; and
an antenna operatively coupled to the frequency converter.

22. The device of claim 21, wherein the frequency converter comprises a downconverter operative to frequency downconvert an input radio frequency (RF) signal with the LO signal and provide a downconverted signal.

23. The device of claim 21, wherein the frequency converter comprises an upconverter operative to frequency upconvert an input baseband signal with the LO signal and provide an upconverted signal.

24. The device of claim 21, further comprising a processor operative to provide a first integer ratio and the non-integer ratio for the first frequency and to provide a second integer ratio for the second frequency to the frequency synthesizer.

25. The device of claim 21, wherein the oversampling ratio is a ratio of the reference frequency to the closed-loop bandwidth of the frequency synthesizer.

26. A method comprising:
generating, at a frequency synthesizer, a fine tuning signal at a first frequency based on a reference signal at a reference frequency, wherein the first frequency is determined by multiplying the reference frequency by a non-integer ratio, and wherein the first frequency is adjustable in fine steps;
generating an output signal at an output frequency based on the fine tuning signal and the reference signal, the output frequency determined based on the first frequency and a second frequency, the second frequency adjustable in coarse steps, wherein a closed-loop bandwidth of the frequency synthesizer is based on noise shaping, and wherein the noise shaping is based on an oversampling ratio; and
generating a coarse tuning signal at the second frequency based on the output signal and the fine tuning signal, wherein the coarse tuning signal has a first sideband defined by a difference between the output frequency and the first frequency, and wherein the coarse tuning signal has a second sideband defined by a sum of the output frequency and the first frequency.

27. The method of claim 26, wherein generating the output signal further comprises:
dividing the coarse tuning signal in frequency to obtain a feedback signal at the reference frequency;
generating an error signal based on the reference signal and the feedback signal; and
filtering the error signal to obtain a control signal for adjusting the output frequency of the output signal.

28. The method of claim 27, wherein dividing the coarse tuning signal comprises dividing the coarse tuning signal in frequency by an integer ratio.

29. The method of claim 26, wherein generating the output signal further comprises dividing the output signal in frequency by an integer ratio to obtain a divider output signal, and wherein the coarse tuning signal is generated based on the divider output signal and the fine tuning signal.

30. The method of 26, wherein generating the fine tuning signal comprises dividing the fine tuning signal in frequency by the non-integer ratio to obtain a feedback signal.

31. The method of claim 26, wherein generating the output signal comprises generating the output signal with a coarse tuning loop having a first closed-loop bandwidth, and wherein generating the fine tuning signal comprises generating the fine tuning signal with a fine tuning loop having a second closed-loop bandwidth wider than the first closed-loop bandwidth by a factor of at least two.

32. The method of claim 26, wherein the oversampling ratio of the reference frequency to the closed-loop bandwidth of the frequency synthesizer.

33. An apparatus comprising:
a frequency synthesizer comprising:
means for generating a fine tuning signal at a first frequency based on a reference signal at a reference frequency wherein the first frequency is determined by multiplying the reference frequency by a non-integer ratio, the first frequency adjustable in fine steps;
means for generating an output signal at an output frequency based on the fine tuning signal and the reference signal, the output frequency being determined based on the first frequency and a second frequency, the second frequency adjustable in coarse steps, the second frequency being an integer multiple of the reference frequency, wherein a closed-loop bandwidth of the frequency synthesizer is based on noise shaping, and wherein the noise shaping is based on an oversampling ratio; and
means for generating a coarse tuning signal at the second frequency based on the output signal and the fine tuning signal, wherein the coarse tuning signal has a first sideband defined by a difference between the output frequency and the first frequency, and wherein the coarse tuning signal has a second sideband defined by a sum of the output frequency and the first frequency.

34. The apparatus of claim 33, wherein the means for generating the output signal further comprises:
means for dividing the coarse tuning signal in frequency to obtain a feedback signal at the reference frequency,
means for generating an error signal based on the reference signal and the feedback signal, and
means for filtering the error signal to obtain a control signal for adjusting the output frequency of the output signal.

35. The apparatus of claims 33, wherein the means for generating the fine tuning signal comprises means for dividing the fine tuning signal in frequency by the non-integer ratio to obtain a feedback signal.

36. The apparatus of claim 33, wherein the oversampling ratio is a ratio of the reference frequency to the closed-loop bandwidth of the frequency synthesizer.

37. A computer program comprising:
a non-transitory computer readable medium comprising:
code for causing at least one computer to receive a first reference signal at a first reference frequency and a second reference signal at a second reference frequency, wherein the first reference frequency is lower than the second reference frequency;
code for causing the at least one computer to provide a first control to generate a fine tuning signal at a the first frequency based on the first reference signal at the first reference frequency, wherein the first frequency is determined by multiplying the first reference frequency by a non-integer ratio, wherein a delta-sigma modulator generates a bit sequence based on a fractional portion input, wherein a summer sums the bit sequence with an integer portion input to generate the non-integer ratio, wherein the first frequency is adjustable in fine steps, and wherein the fine steps correspond to integer multiples of a step size that is based at least in part on a number of bits includes in the fractional portion input;
code for causing the at least one computer to provide a second control to generate an output signal at the output frequency determined based on the first frequency and a second frequency, the second frequency adjustable in coarse steps, wherein a closed-loop bandwidth of the frequency synthesizer is based on noise shaping, and wherein the noise shaping is based on an oversampling ratio;
code for causing the at least one computer to provide a third control to generate a coarse tuning signal at the second frequency based on the output signal and the fine tuning signal, wherein the second frequency is an integer multiple of the second reference frequency, and wherein the coarse tuning signal has a first sideband defined by a difference between the output frequency and the first frequency, and wherein the coarse tuning signal has a second sideband defined by a sum of the output frequency and the first frequency.

38. The computer program product of claim 37, wherein the oversampling ratio is a ratio of the second reference frequency to the closed-loop bandwidth of the frequency synthesizer.

39. The computer program product of claim 37, wherein the step size is determined according to a formula:

$$\text{step size} = f_{ref}/2^B$$

wherein $f_{ref}$ is the first reference frequency and B is the number of bits included in the fractional portion input.

* * * * *